US011424201B2

(12) United States Patent
Rogalli et al.

(10) Patent No.: US 11,424,201 B2
(45) Date of Patent: Aug. 23, 2022

(54) METHOD OF FORMING AN ALUMINUM OXIDE LAYER, METAL SURFACE WITH ALUMINUM OXIDE LAYER, AND ELECTRONIC DEVICE

(71) Applicant: Infineon Technologies AG, Neubiberg (DE)

(72) Inventors: Michael Rogalli, Rottenburg (DE); Johann Gatterbauer, Parsberg (DE); Wolfgang Lehnert, Lintach (DE); Kurt Matoy, Strau (AT); Evelyn Napetschnig, Diex (AT); Manfred Schneegans, Vaterstetten (DE); Bernhard Weidgans, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 440 days.

(21) Appl. No.: 16/012,341

(22) Filed: Jun. 19, 2018

(65) Prior Publication Data

US 2018/0366427 A1 Dec. 20, 2018

(30) Foreign Application Priority Data

Jun. 20, 2017 (DE) .......................... 102017113515.4

(51) Int. Cl.
*H01L 23/00* (2006.01)

(52) U.S. Cl.
CPC .............. *H01L 24/05* (2013.01); *H01L 24/03* (2013.01); *H01L 24/13* (2013.01); *H01L 24/45* (2013.01);

(Continued)

(58) Field of Classification Search
CPC ......... H01L 24/03; H01L 24/05; H01L 24/13; H01L 24/45; H01L 2924/05432; H01L 2224/0104; H01L 2224/04042; H01L 2224/05007; H01L 2224/05073; H01L 2224/05147; H01L 2224/05139; H01L 2224/05155; H01L 2224/05124; H01L 2224/05164; H01L 2224/03827;

(Continued)

(56) References Cited

U.S. PATENT DOCUMENTS

2004/0203254 A1* 10/2004 Conley, Jr. ........ C23C 16/45527
438/778
2005/0136554 A1* 6/2005 Okita ..................... H01L 28/57
438/3

(Continued)

FOREIGN PATENT DOCUMENTS

WO 2016131024 A1 8/2016

*Primary Examiner* — Julio J Maldonado
*Assistant Examiner* — John M Parker
(74) *Attorney, Agent, or Firm* — Murphy, Bilak & Homiller, PLLC

(57) ABSTRACT

A method of forming an aluminum oxide layer is provided. The method includes providing a metal surface including at least one metal of a group of metals, the group of metals consisting of copper, aluminum, palladium, nickel, silver, and alloys thereof. The method further includes depositing an aluminum oxide layer on the metal surface by atomic layer deposition, wherein a maximum processing temperature during the depositing is 280° C., such that the aluminum oxide layer is formed with a surface having a liquid solder contact angle of less than 40°.

13 Claims, 7 Drawing Sheets

(52) U.S. Cl.
CPC .... *H01L 24/48* (2013.01); *H01L 2224/02166* (2013.01); *H01L 2224/0381* (2013.01); *H01L 2224/0382* (2013.01); *H01L 2224/0391* (2013.01); *H01L 2224/03452* (2013.01); *H01L 2224/03848* (2013.01); *H01L 2224/04026* (2013.01); *H01L 2224/04034* (2013.01); *H01L 2224/04042* (2013.01); *H01L 2224/05124* (2013.01); *H01L 2224/05139* (2013.01); *H01L 2224/05147* (2013.01); *H01L 2224/05155* (2013.01); *H01L 2224/05164* (2013.01); *H01L 2224/05573* (2013.01); *H01L 2224/05624* (2013.01); *H01L 2224/05647* (2013.01); *H01L 2224/05655* (2013.01); *H01L 2224/05664* (2013.01); *H01L 2224/05687* (2013.01); *H01L 2224/13101* (2013.01); *H01L 2224/13111* (2013.01); *H01L 2224/29111* (2013.01); *H01L 2224/37147* (2013.01); *H01L 2224/4502* (2013.01); *H01L 2224/45124* (2013.01); *H01L 2224/45144* (2013.01); *H01L 2224/45147* (2013.01); *H01L 2224/48463* (2013.01); *H01L 2224/48847* (2013.01); *H01L 2224/83447* (2013.01); *H01L 2224/84801* (2013.01); *H01L 2224/85375* (2013.01); *H01L 2924/05432* (2013.01); *H01L 2924/10253* (2013.01); *H01L 2924/15747* (2013.01)

(58) Field of Classification Search
CPC . H01L 2224/03828; H01L 2224/05558; H01L 2224/05562; H01L 2224/05573; H01L 2224/05624; H01L 2224/05687; H01L 2224/08503; H01L 2224/81355; H01L 2224/81379; H01L 2224/8192; H01L 2224/8502; H01L 2224/85355; H01L 2224/85359; H01L 2224/8592; H01L 21/0228; H01L 21/02178; C23C 16/403
See application file for complete search history.

(56) References Cited

U.S. PATENT DOCUMENTS

| | | | | |
|---|---|---|---|---|
| 2005/0253265 | A1* | 11/2005 | Barkyoumb | H01L 21/76843 257/751 |
| 2006/0141708 | A1* | 6/2006 | Kim | H01L 29/42352 438/259 |
| 2011/0217564 | A1* | 9/2011 | Neogi | C23C 24/082 428/553 |
| 2013/0269744 | A1* | 10/2013 | Maeshima | H01L 35/32 136/212 |
| 2014/0183478 | A1* | 7/2014 | Lee | H01L 51/56 257/40 |
| 2015/0021187 | A1* | 1/2015 | Lin | B01L 3/502715 204/601 |
| 2015/0364747 | A1* | 12/2015 | Elam | H01M 4/0426 204/192.1 |
| 2016/0060758 | A1 | 3/2016 | Marquardt et al. | |
| 2017/0170141 | A1* | 6/2017 | Oppermann | H01L 25/50 |

* cited by examiner

710 providing a metal surface comprising at least one metal of a group of metals, the group comprising copper, aluminum, palladium, nickel, silver, and alloys thereof

720 depositing an aluminum oxide protection layer on the metal surface by atomic layer deposition, wherein a maximum processing temperature during the depositing is 280°C, such that the aluminum oxide protection layer is formed with a surface having a liquid solder contact angle of less than 40°

METHOD OF FORMING AN ALUMINUM OXIDE LAYER, METAL SURFACE WITH ALUMINUM OXIDE LAYER, AND ELECTRONIC DEVICE

TECHNICAL FIELD

Various embodiments relate generally to a method of forming an aluminum oxide layer, to a metal surface with an aluminum oxide layer, and to an electronic device.

BACKGROUND

Enhanced power devices may require bare copper as a back end of line metallization. Copper may stand out due to excellent electrical and thermomechanical properties.

FIG. 1A and FIG. 1B each show an electronic device 100, 101, respectively. Each of the electronic devices 100, 101 may include a connection between a surface of a copper layer 102 and a copper contact structure 104: FIG. 1A shows a bond wire 104a contact, and FIG. 1B shows a solder contact between a copper clip 104b and the copper layer 102. As can be seen in FIG. 1A and FIG. 1B, in regions marked as 106, the copper layer 102 is directly in contact with the copper contact structure 104a (in FIG. 1A) or with the solder (in FIG. 1B), respectively, without any protection layer in between.

Since, as opposed to aluminum, copper surfaces may strongly oxidize and prevent (hinder) subsequent assembly operations, like for example wire bonding and soldering, special measures have to be taken for forming the electrically conductive contact between the copper layer and the copper contact structure.

As a way to overcome this problem, the copper surface may be provided with a protection against oxidation. State of the art may be a using of additional metal(s), like for example nickel (Ni(x)), palladium (Pd) and/or gold (Au), which may for example be arranged as a stack of layers formed on the copper surface. Alternatively, an extremely thin dielectric layer may be formed on the copper surface.

The application of additional metals on the copper may be highly sophisticated and therefore very expensive. In addition, it may be necessary to take care of (e.g. prevent and/or remove) an Au contamination on a backside of a wafer.

A cheaper approach may be a deposition of a thin dielectric in a batch process. Until now, such a kind of surface protection may only be suitable for a wire bonding assembly, because the dielectric layer may be mechanically removed during the bonding process by a scrubbing of the thin layer.

However, for allowing a contacting using soldering, the soldering process may require a direct contact to the copper surface. Dielectric layers may inhibit the wetting (of the copper surface with the solder) and a formation of an intermetallic phase.

SUMMARY

A method of forming an aluminum oxide layer is provided. The method may include providing a metal surface comprising at least one metal of a group of metals, the group of metals consisting of copper, aluminum, palladium, nickel, silver, and alloys thereof, and depositing an aluminum oxide layer on the metal surface by atomic layer deposition, wherein a maximum processing temperature during the depositing is 280° C., such that the aluminum oxide layer is formed with a surface having a liquid solder contact angle of less than 40°.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a process flow for a method of forming an aluminum oxide layer according to various embodiments.

DETAILED DESCRIPTION

Figure 1A:
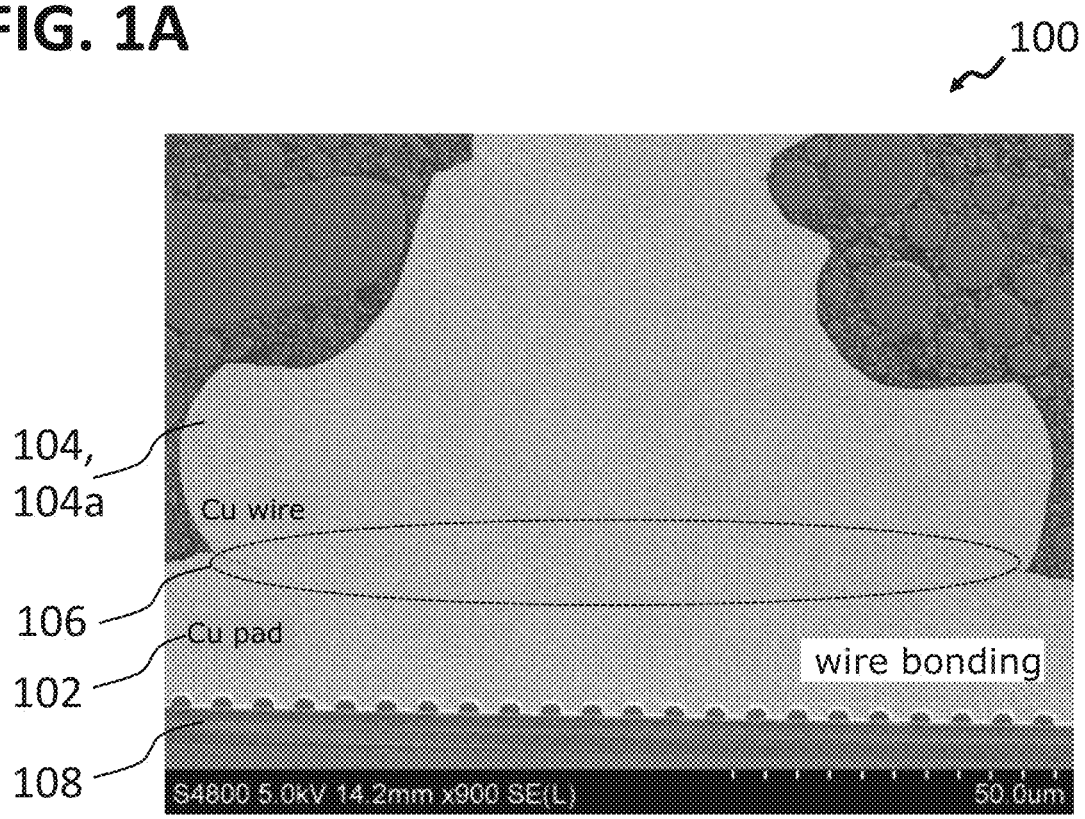
FIG. 1A shows a cross-sectional view of a wire bond contact between a copper surface and a copper wire.
Figure 1B:
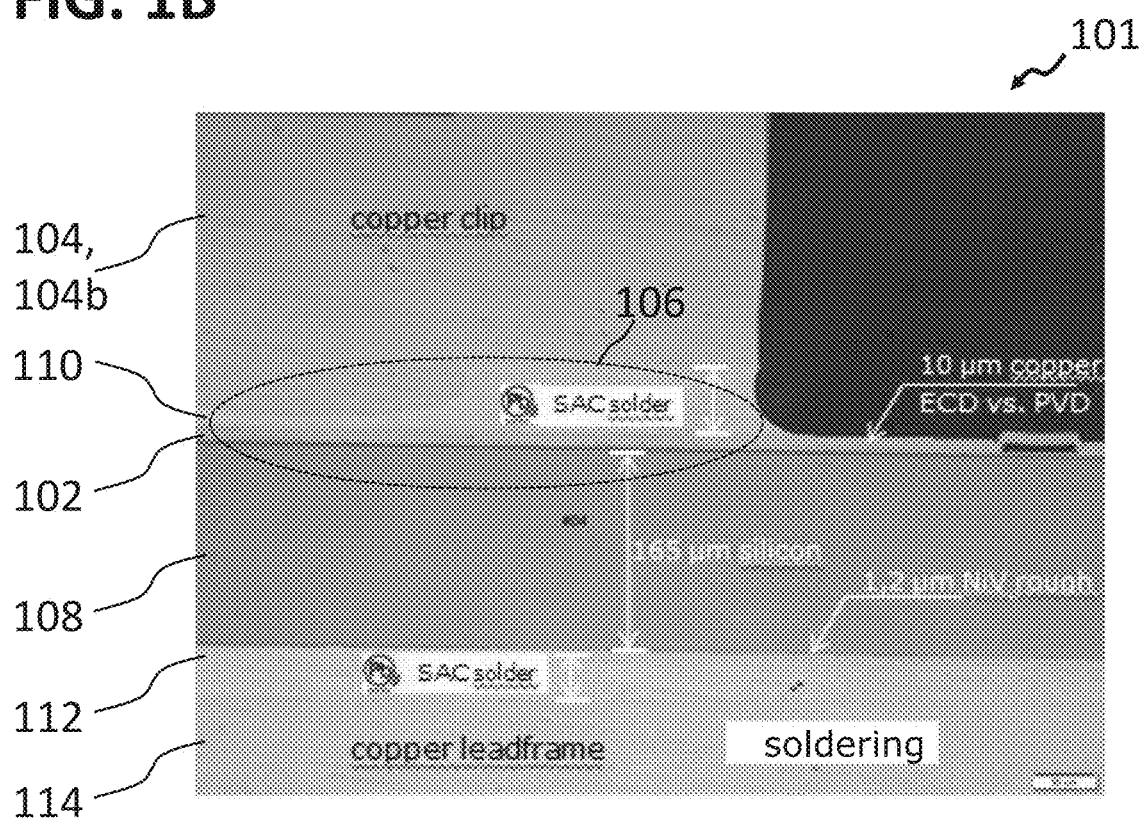
FIG. 1B shows a cross-sectional view of a solder contact between a copper surface and a copper contact structure.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The metal of the metal surface may in various embodiments not be restricted to copper, even though copper may be used in the various embodiments described in context with the figures. Instead or in addition, the metal may be a different easily oxidizing metal, for example aluminum, palladium, nickel, silver, and/or alloys thereof.

In various embodiments, a designed protection layer, which may be sufficient to prevent a metal (e.g. copper) oxidation, and which may be based on aluminum oxide $Al_2O_3$, may be provided on the metal (e.g. copper) surface. This special protection may, in addition to being configured to prevent copper oxidation, at the same time also enable a contact of the metal (e.g. copper) surface with a solder and create an intermetallic phase.

In the Figures and the description, the aluminum oxide layer in accordance with various embodiments may also be referred to as "Pro.Cu+", whereas a known aluminum oxide layer having a low wettability, thereby preventing or hindering the soldering, may be referred to as "Pro.Cu".

In various embodiments, the special properties, e.g. a high wettability by solder while at the same time providing protection from oxidation, may be provided by applying a modified atomic layer deposition (ALD) recipe.

This multifunctional protection film may in various embodiments be realized by an atomic layer deposition, in which copper conditioning steps to prevent copper oxidation may be executed in a conventional way, which may however be followed by a low temperature deposition (for example with a temperature below about 280° C., e.g. below 200° C.), which may lead to a forming of a hydrophilic (weaker) film of aluminum oxide (Pro.Cu+). The hydrophilic aluminum oxide layer may be configured to enable soldering.

Herein, the familiar term "hydrophylic" may be used, even though it may not be a good wettability by water ("hydro" in ancient greek) that may be relevant in this context, but rather a good wettability by a (liquid) solder and/or by a flux (also referred to as a flux agent). Depending on a liquid (e.g., solder, flux, water etc.) used for the wettability measurement, a contact angle, which may be indicative of a wettability by the liquid, may vary. Similarly, the term "hydrophobic" may be used for describing a bad wettability, wherein the (bad) wettability by solder and/or flux may be most relevant in the context.

The process sequence in accordance with various embodiments may create a highly amorphous and hydrophilic layer of aluminum oxides. This surface conditioning combines oxidation protection and solderability of Cu surface with standard lead-free and lead containing solder materials, without a necessity to use special adapted solder materials (e.g. a special flux agent).

One key aspect of various embodiments may be a provision of a hydrophilic aluminum oxide based layer with multifunctional properties. The aluminum oxide based layer may be configured to protect the Cu metal against corrosion, and at the same time it may be configured to not be a complete barrier for metal/metal-oxide diffusion. The hydrophilic aluminum oxide based layer may in various embodiments be applicable (e.g., may provide no blocking) for additional backend processes, may easily be implemented into a front end process flow, may be cheap (for example because a batch-processing may be possible), and may improve a yield of wire- and solder connections, and a reliability of electronic devices including the wire- and/or solder connections.

In various embodiments, the aluminum oxide layer may be suitable for both, a solder connection and a wire bond connection.

In various embodiments, the multifunctional properties may be reached by a deposition of aluminum oxides with a thickness of between about 1 nm and about 12 nm, wherein the depositing may be performed at a deposition temperature of between about 150° C. and about 300° C., which may be high enough to grow a layer that may prevent the oxidation and corrosion of the copper surface (at least long enough), such that a processing up to an encapsulation process (e.g. using a mold) may be possible without significant discolorations. On the other hand, the deposition temperature may also be low enough to provide a highly hydrophilic layer that may allow metal/metal-oxide diffusion into it. This property may provide a good wetting by the solder and/or flux, and may locally enable the flux to remove the aluminum oxide passivation layer during soldering, such that a good contact (intermetallic phase) to the pad may be formed.

In various embodiments, for each metal included in the metal surface, an optimum thickness of the aluminum oxide layer may exist. The optimum thickness may depend on a readiness of diffusion of the metal, and on a readiness for oxidation of the metal.

For example, for a metal readily diffusing into the low-density aluminum oxide while being kept at elevated, but relatively low temperatures of up to 280° C. (an optimum processing temperature may in various embodiments also be determined based on the metal included in the metal surface), and being quickly oxidized may allow or require a relatively thick aluminum oxide layer, for example having a thickness of about 8 nm to about 12 nm.

On the other hand, a metal slowly diffusing into the low-density aluminum oxide while being kept at elevated, but relatively low temperatures of up to 280° C., and being slowly oxidized may allow or require a relatively thin aluminum oxide layer, for example having a thickness of about 1 nm to about 6 nm.

In various embodiments of a slowly diffusing, but readily oxidizing metal, a thick aluminum oxide layer (e.g. between about 8 nm and about 12 nm) may be required, which may make it necessary to have a comparatively long processing duration of keeping the metal surface with the aluminum oxide layer at the elevated temperature, for example during the depositing of the aluminum oxide layer and/or during a subsequent annealing. The processing time may in that case for example be in a range from about two hours to about 10 hours.

In various embodiments of a readily diffusing, but slowly oxidizing metal, a thin aluminum oxide layer (e.g. between about 1 nm and about 6 nm) may be required, which may make it possible to have a comparatively short processing duration of keeping the metal surface with the aluminum oxide layer at the elevated temperature, for example during the depositing of the aluminum oxide layer and/or during a subsequent annealing. The processing time may in that case for example be in a range from about 0.5 hours to about two hours.

For a copper surface, which may quite readily diffuse into the aluminum oxide layer, an optimum thickness of the aluminum oxide layer may be about 6 nm, and an optimum processing time may be between about 1.5 hours and about 2.5 hours, e.g. about two hours.

In various embodiments, other metal surfaces on which the aluminum oxide layer may be formed may for example include palladium, aluminum, silver, nickel, and/or alloys including these materials.

In various embodiments, the low deposition temperature for the aluminum oxide ($Al_2O_3$) layer using ALD may be beneficial in a case of an application of higher temperatures being prohibited due to technical reasons, e.g. for a deposition on an organic material that may not tolerate higher temperatures.

The conventional aluminum oxide layer may have a low wettability, solder, such that a solder connection between a metal contact structure and a metal surface underneath the aluminum oxide layer may only be established if the aluminum oxide layer is either removed (e.g. mechanically or chemically) before the soldering, or if the aluminum oxide layer is removed during the soldering, for example by using an especially dedicated flux configured to remove the aluminum oxide layer during the soldering process.

In the known process, a metal (e.g. copper) surface may be cleaned from oxides that may have formed on the surface, e.g. cleaned from copper oxide, for example by reducing copper oxide to copper. The cleaning process may for example include applying a forming gas to the copper surface for reducing the copper oxide.

After the cleaning, a seed layer for the aluminum oxide layer may be formed. The forming of the seed layer may include depositing an aluminum-ALD-precursor (also referred to as aluminum precursor) on the metal surface. For example, trimethylaluminum ($AlCH_3)_3$, TMA) may be used. During the depositing, the processing temperature may be approximately 200° C. The TMA may be chemisorbed to the copper surface, thereby forming Al—O—Cu-bonds replacing the Al—$CH_3$-bonds of the TMA, until the surface may be saturated with chemisorbed TMA. Excessive TMA and $CH_3$ groups may be removed by another cleaning process, for example using an inert gas.

An oxidizing precursor, like for example water and/or alcohol (e.g. isopropanol) may be used for replacing methyl groups of the chemisorbed TMA by OH groups for forming Al—O—Al bonds between adjacent chemisorbed TMA molecules. The chemisorption of water and/or alcohols may take place until a saturation of the surface is reached.

Another cleaning process may be executed, for example for removing excess methyl groups and/or water and/or alcohol. For example, an inert gas may be used for the other cleaning process.

After the cleaning process, one or more further reaction cycles may be executed until a desired layer thickness is reached, wherein a temperature during the depositing of the TMA and of the water and/or alcohol may be around 350° C. The obtained aluminum oxide layer may be hydrophobic, may be able to protect the copper surface from oxidation and may be configured to be breakable during a wire bonding process.

Even though many subprocesses of the process of forming an aluminum oxide layer in accordance with various embodiments may be similar or identical to the subprocesses described above for forming the hydrophobic layer, keeping, in accordance with various embodiments, a temperature during a depositing of the aluminum oxide layer at 280° C. or lower, for example in a range from about 150° C. to about 280° C., e.g. from about 170° C. to about 230° C., for example around 200°, may surprisingly lead to a hydrophylic aluminum oxide layer, or rather, since it is the wettability by solder that may be relevant, to a good wettability by solder, e.g. a solder suitable for soldering the metal surface on which the aluminum oxide layer is formed and a metal contact structure. A measure for the good wettability by the solder may be a contact angle of the liquid solder, which may be below about 40°, e.g. below about 30°, e.g. below about 25°, e.g. below about 20°, e.g. in a range from about 10° to about 20°.

The solder used for determining the wettability by measuring the contact angle may in various embodiments be a solder that is suitable for forming a solder connection between the metal that is included in the metal surface and the metal contact structure to be electrically conductively connected to the metal surface. In various embodiments, the solder may be a lead-free solder, and the soldering may be performed without use of a flux. The solder may in various embodiments be a solder including tin (Sn), for example between about 2% and about 20% of tin, for example as a diffusion solder that may include tin, or a solder system including copper and tin (Cu, Sn), or a nickel-tin-solder (Ni, Sn), or a nickel-tin-silver solder (Ni, Sn, Ag), or an Sn based solder containing antimony (Sb), silver (Ag), and/or germanium (Ge) in various compositions.

The temperature may in various embodiments not be raised above 280° C., e.g. not above 230° C., e.g. up to only about 200° C. during the depositing of the aluminum oxide, during a depositing of TMA and during a depositing of water and/or alcohol, which may be used for forming the aluminum oxide layer. In various embodiments, the temperature may furthermore not be raised above 280° C., e.g. not above 230° C., e.g. up to only about 200° C. after the depositing of the aluminum oxide, for example during a tempering process.

In various embodiments, a duration of the depositing process may be at least half an hour, for example between about 0.5 hours and about 10 hours, for example between about one hour and about four hours, for example between about 1.5 hours and about three hours, for example about two hours. In various embodiments, the depositing process may be shorter, for example shorter than about two hours, e.g. shorter than about 1.5 hours, e.g. shorter than about one hour, e.g. shorter than about 0.5 hours, e.g. between 0.25 hours and less than 0.5 hours. However, subsequent to the depositing, a low-temperature annealing (with a maximum temperature of 280° C.) may be executed after the depositing. In various embodiments, a combination of the depositing process and an annealing process may be configured to introduce a thermal budget into the metal-aluminum oxide-system that may cause diffusion of some metal from the metal surface into the aluminum oxide layer. In various embodiments, a relatively long duration (longer than about half an hour) of the depositing process or of a combination of the depositing process and the annealing process, in combination with the relatively low depositing/annealing temperature (of no more than about 280° C.) may allow for the forming of the aluminum oxide layer having a low density (lower than the conventional aluminum oxide layer formed as described in connection with FIG. 2A), which may provide for spaces within the aluminum oxide layer into which metal from the metal surface (e.g. copper) may diffuse. In various embodiments, the aluminum oxide layer may include copper at a percentage by mass of at least 5 wt %, e.g. between about 5 wt % and about 20 wt %.

The aluminum oxide layer may in various embodiments be formed as an amorphous layer.

In various embodiments, the depositing process may be continued (e.g. repeated) until a desired thickness of the aluminum oxide layer is obtained. The aluminum oxide layer may, in various embodiments, have a thickness of between 1 nm and 12 nm, for example between about 4 nm and 10 nm, for example between 5 nm and 8 nm, for example around 6 nm.

In various embodiments, the thickness of the aluminum oxide layer between 1 nm and 12 nm may on the one hand ensure that the aluminum oxide layer is thick enough for protecting the metal (e.g. copper) surface from oxidation, and on the other hand thin enough for allowing the solder connection through/by the aluminum oxide layer, which may include metal (e.g. copper) from the metal surface diffused therein. The metal (e.g. copper) content included in the aluminum oxide layer may in various embodiments decrease from the metal-aluminum oxide-interface (the corresponding surfaces may be referred to as top surface for the metal and bottom surface for the aluminum oxide layer, respectively) towards a surface of the aluminum oxide layer facing away from the metal surface (also referred to as top surface (of the aluminum oxide layer)).

For an aluminum oxide layer having a thickness of more than about 12 nm, the metal content in the aluminum oxide layer near the top surface may be too low for forming the solder connection through/by the aluminum oxide layer.

For an aluminum oxide layer having a thickness of less than about 1 nm, an oxidation of the metal of the metal surface may not be prevented or delayed long enough for being technically useful. For example, the oxidation may typically take place before an electrically contacting (e.g. using soldering or wire bonding) is finished.

In various embodiments, the aluminum oxide layer may be configured for forming a wire bond connection therethrough, for example by mechanically removing the aluminum oxide layer, e.g. by rubbing and/or scratching the aluminum oxide layer during a forming of the wire bond connection.

Figure 2A:
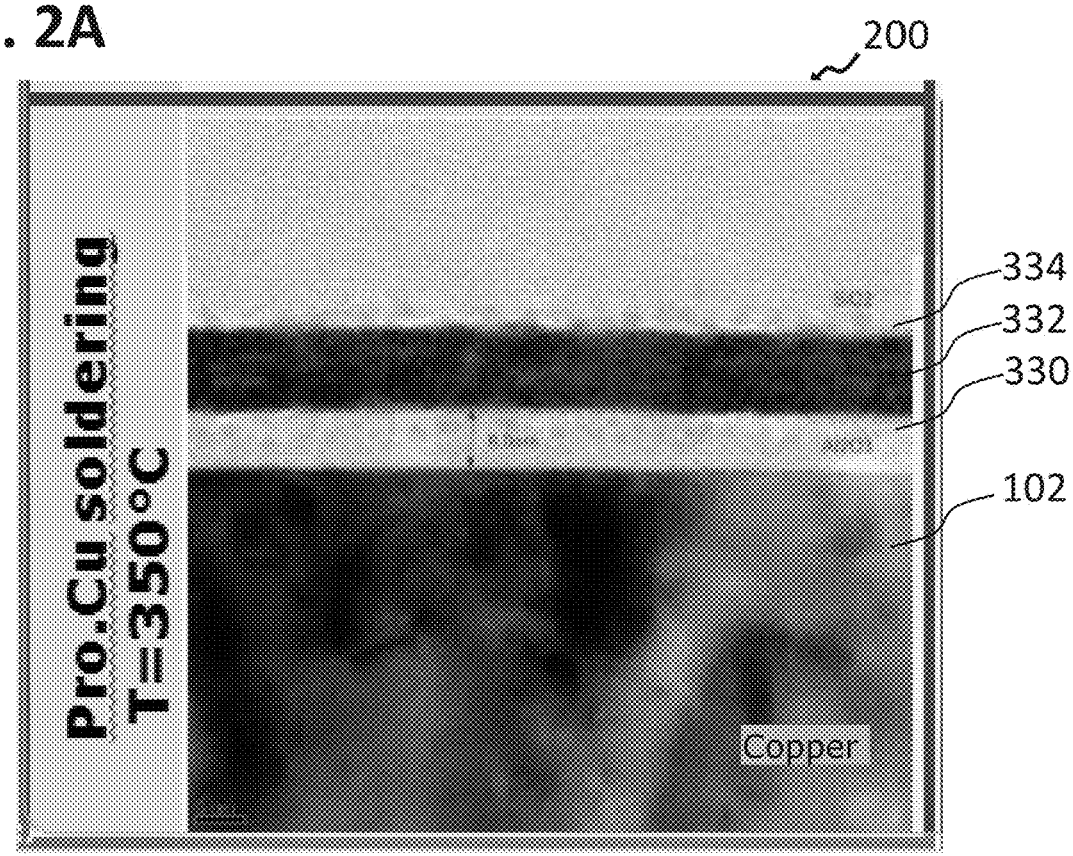
FIG. 2A shows a cross-sectional view of a layer structure including copper, an aluminum oxide layer, and a solder.

FIG. 2A shows a cross-sectional view of a layer structure including copper, an aluminum oxide layer, and a solder. The aluminum oxide layer may for example have been formed as described above for the conventional aluminum oxide layer.

The layer structure 200 may include a metal (e.g. copper) layer 102 and a hydrophobic aluminum oxide layer 330. The layer structure 200 may further include a solder 332, which may have been applied to the hydrophobic aluminum oxide layer 330 using a flux or other measure for allowing the solder 332 to be arranged over the hydrophobic aluminum oxide layer 330. A silicon dioxide layer 334 may furthermore be arranged over the solder 332.

Figure 2B:
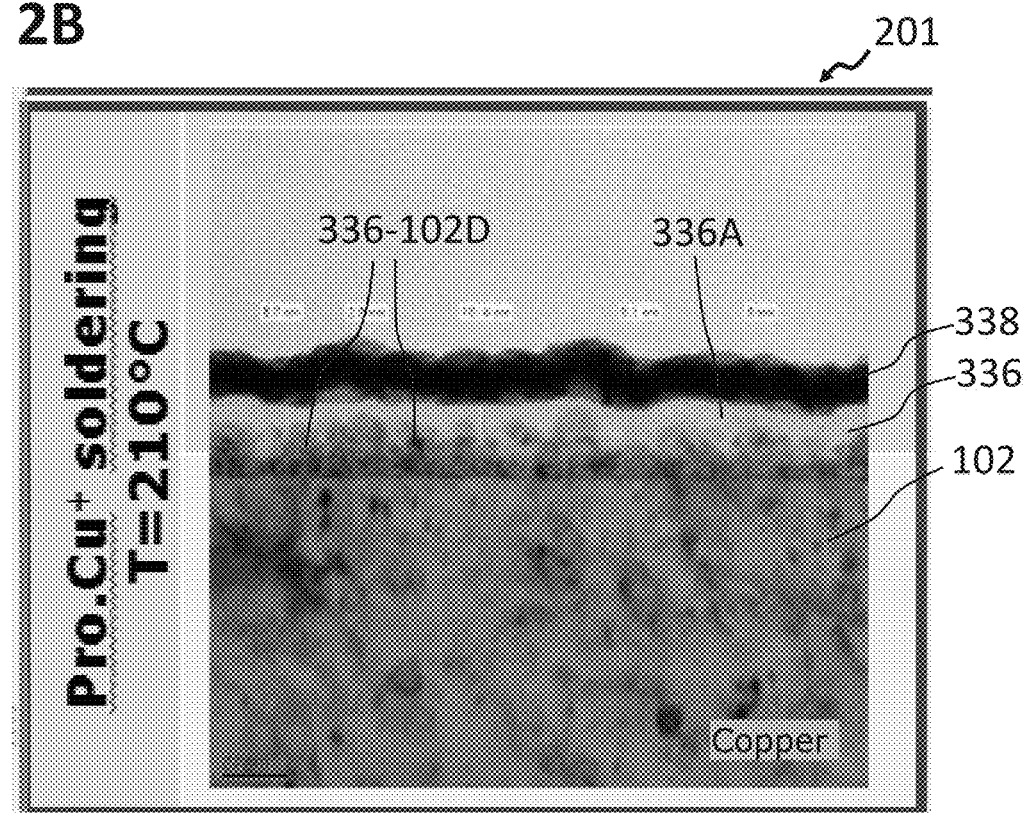
FIG. 2B shows a cross-sectional view of a copper surface with an aluminum oxide layer and a solder in accordance with various embodiments.

FIG. 2B shows a cross-sectional view of a metal (e.g. copper) layer 102 having a metal (e.g. copper) surface with an aluminum oxide layer 336 formed on the metal surface and a solder 338 arranged on the aluminum oxide layer 336, in accordance with various embodiments. The aluminum oxide layer 336 may have been formed as described above.

As described above, in various embodiments, the hydrophilic aluminum oxide layer 336 may be less dense than the conventional hydrophobic aluminum oxide layer 332, and may include some metal from the metal surface diffused into the aluminum oxide layer 336. Some of the areas having the metal diffused into the aluminum oxide layer 336, showing up in the cross-sectional view of FIG. 2B as darker areas 102-336D in an aluminum oxide portion 336A of the aluminum oxide layer 336 shown in a lighter-grey. The metal diffused into the aluminum oxide layer 336 may in various embodiments allow for a forming of a solder connection between the solder 338, which may have been applied without using a flux, and the metal 102.

Figure 3A:
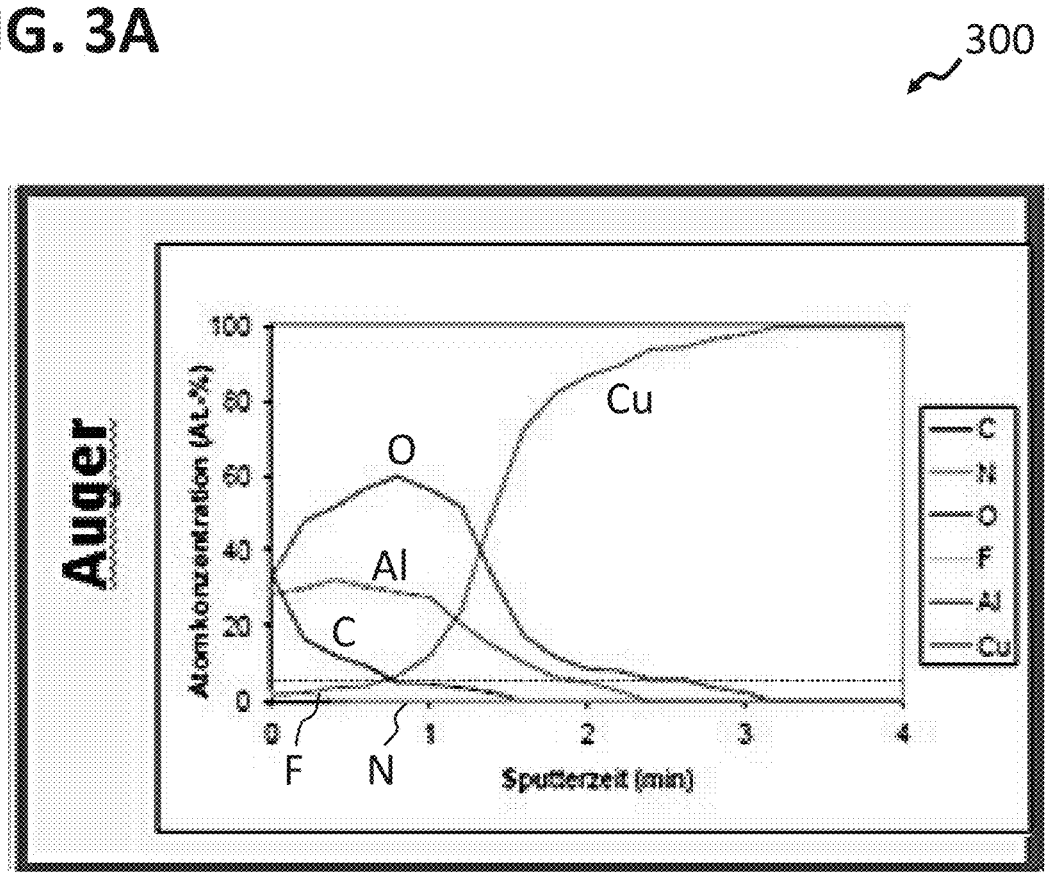
FIG. 3A shows a graph with results of an Auger electron spectroscopy analysis of a copper surface having a conventional aluminum oxide layer formed thereon.

FIG. 3A shows a graph 300 with results of an Auger electron spectroscopy analysis of a copper surface having a conventional aluminum oxide layer formed thereon.

Figure 3B:
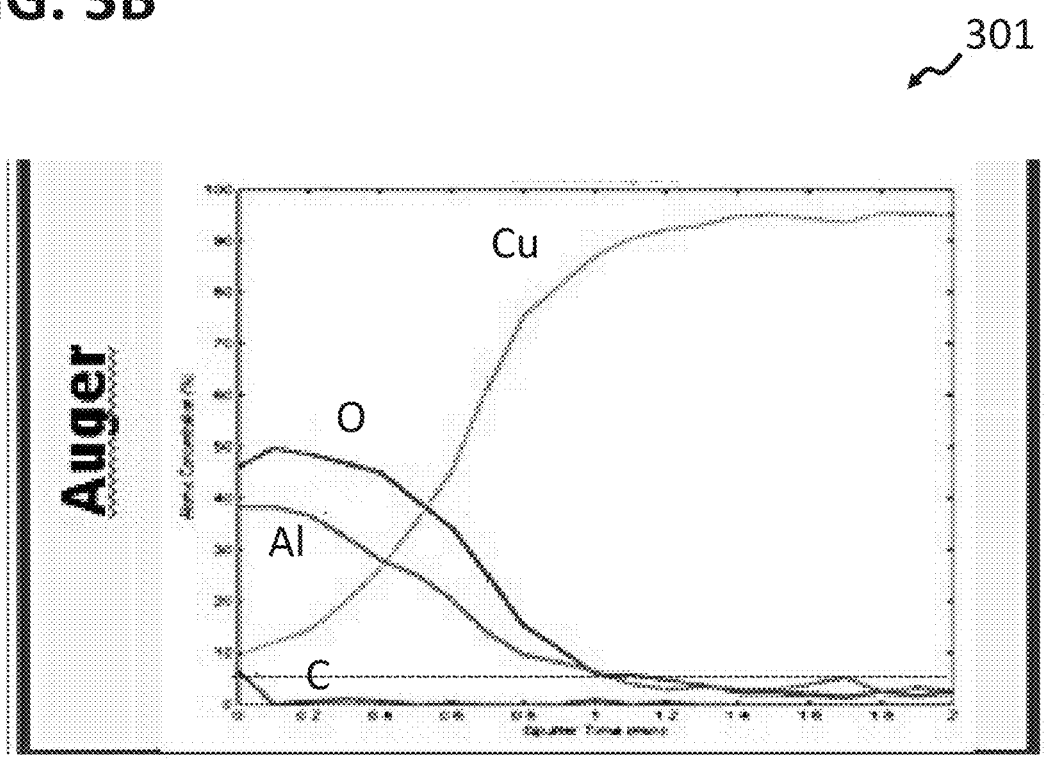
FIG. 3B shows a graph with results of an Auger electron spectroscopy analysis of a copper surface having an aluminum oxide layer in accordance with various embodiments formed thereon.

FIG. 3B shows a graph 301 with results of an Auger electron spectroscopy analysis of a copper surface having an aluminum oxide layer in accordance with various embodiments formed thereon.

The Auger electron spectroscopy results shown in FIG. 3A and FIG. 3B may reveal that the conventional aluminum oxide layer 330, which may be formed as described above in connection with FIG. 2A, may include almost no copper, in particular near the surface of the aluminum oxide layer 330 facing away from the metal surface (also referred to as the top surface of the aluminum oxide layer 330). For example, a metal (e.g. copper) content in the aluminum oxide layer 330 may be below about 5 wt % at the top surface of the aluminum oxide layer 330. The copper content may for example be between about 1 wt % and 2 wt % or lower.

In contrast to FIG. 3A, FIG. 3B shows that a metal (e.g. copper) content in the aluminum oxide layer 336 formed in accordance with various embodiments, for example as described above in context with FIG. 2B, may include a much higher metal content, for example a metal content of about 5 wt % or more.

As shown in FIG. 3B, the metal content may be decreasing from the bottom surface of the aluminum oxide layer 336 to the top surface of the aluminum oxide layer 336. Even though it may not look like this in FIG. 2B, judging from an apparent distribution of the darker areas 336-102D in the lighter gray areas 336A indicating the aluminum oxide, the diffused metal in the aluminum oxide layer may extend all the way through the aluminum oxide layer to the top surface of the aluminum oxide layer 336, where the metal content may be approximately 5 wt % or more.

Figure 4A:
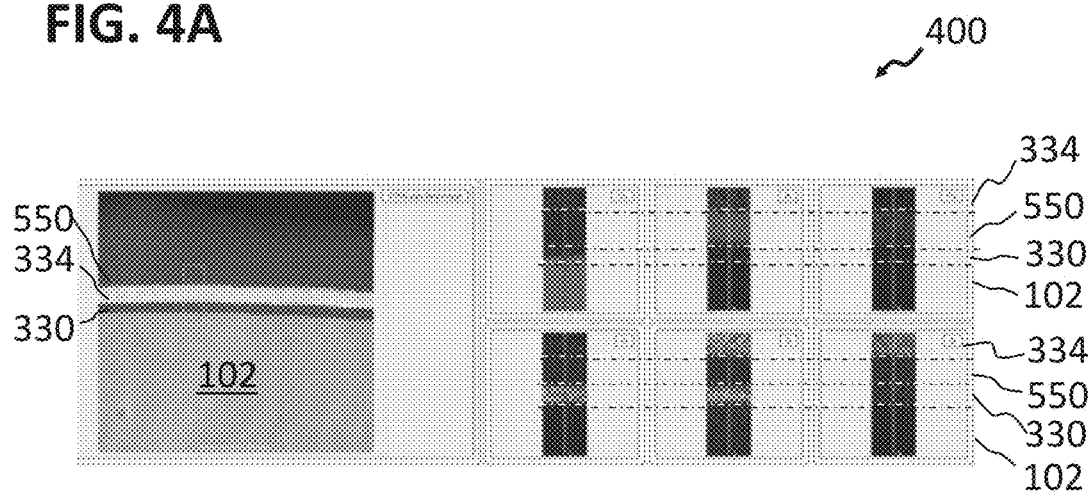
FIG. 4A shows results of a transmission electron microscopy analysis of a copper surface having a conventional aluminum oxide layer formed thereon.

FIG. 4A shows results 400 of a transmission electron microscopy analysis of a copper 102 surface having a conventional aluminum oxide layer 330 formed thereon.

Figure 4B:
FIG. 4B shows results of a transmission electron microscopy analysis of a copper surface having an aluminum oxide layer in accordance with various embodiments formed thereon.

FIG. 4B shows results 401 of a transmission electron microscopy analysis of a copper 102 surface having an aluminum oxide layer 336 in accordance with various embodiments formed thereon.

FIG. 4A and FIG. 4B show in a different visualization essentially the same results regarding a metal content of the conventional aluminum oxide layer 330 and the aluminum oxide layer 336 in accordance with various embodiments as shown in FIG. 3A and FIG. 3B, respectively.

In particular, it may be noted that, in FIG. 4A, the copper (Cu) of the metal layer 102 having the metal surface on which the aluminum oxide layer 330 may be formed, may have a clear-cut separation from the aluminum oxide layer 330.

In contrast to this, in FIG. 4B, the copper (Cu) of the metal layer 102 having the metal surface on which the aluminum oxide layer 336 may be formed, may spread out into the aluminum oxide layer 336. This may be indicative of the diffusion into the (less dense) aluminum oxide layer 336 that may have occurred during the depositing and/or annealing of the aluminum oxide layer 336 in accordance with various embodiments. Thereby, the differing Cu content in the conventional aluminum oxide layer 330 and the aluminum oxide layer 336 in accordance with various embodiments (both may also be referred to as a passivation layer) may be demonstrated.

The aluminum oxide (Al, O) distributions of the respective aluminum oxide layers 330, 336 and the silicon oxide (Si, O) distribution of the silicon oxide layer 334 may be indicated by the respective distributions shown in FIG. 4A and FIG. 4B.

Figure 5A:
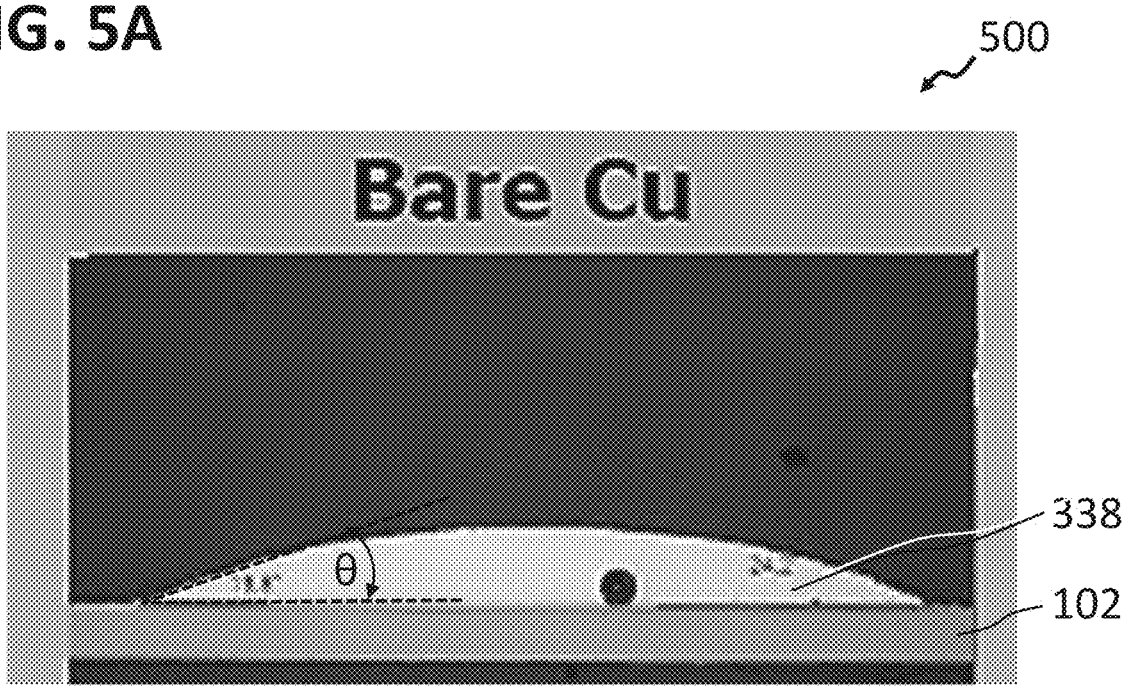
FIG. 5A shows a cross-sectional view of a wetting experiment of liquid solder on bare copper.

FIG. 5A shows a cross-sectional view 500 of a wetting experiment of liquid solder 338 on bare copper 102. For the wetting experiment, a liquid solder ball 338 may be arranged on the bare copper 102 surface.

Figure 5B:
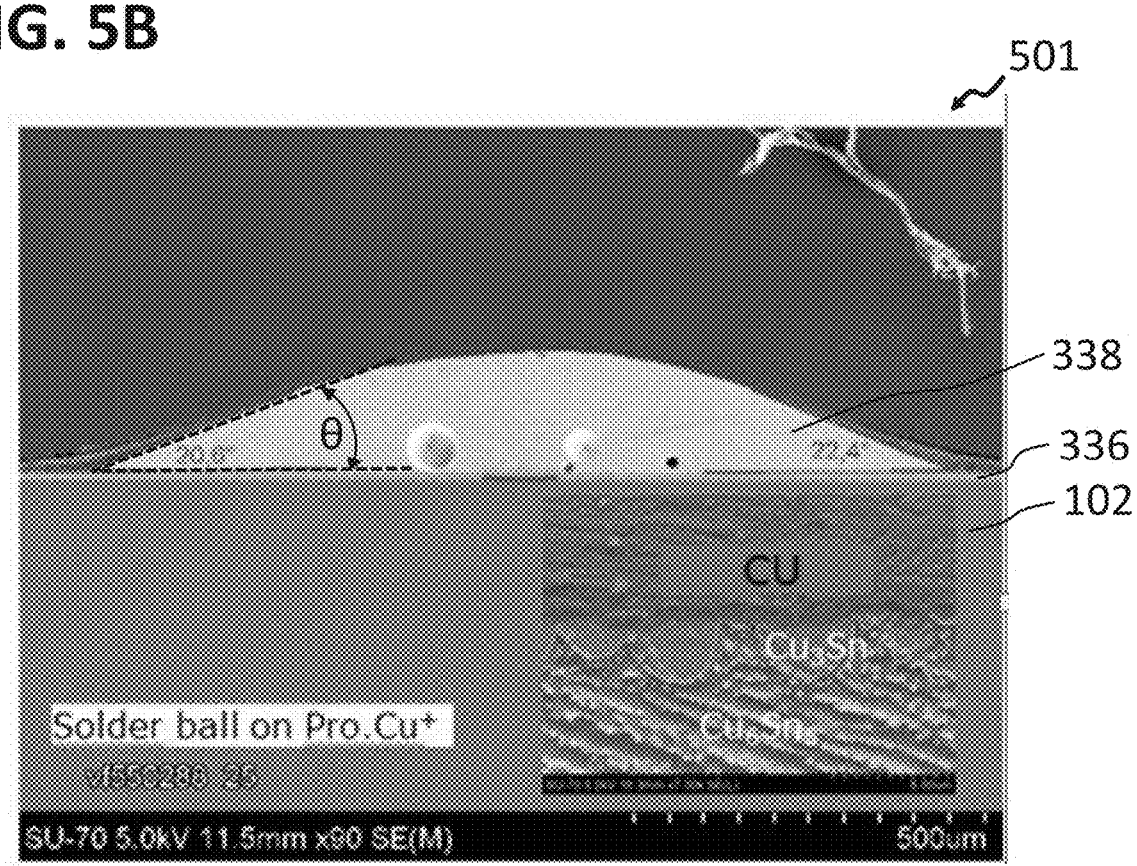
FIG. 5B shows a cross-sectional view of a wetting experiment of liquid solder on the aluminum oxide layer in accordance with various embodiments.

FIG. 5B shows a cross-sectional view 501 of a wetting experiment of liquid solder 332 on the aluminum oxide layer 336 in accordance with various embodiments. For the wetting experiment, a liquid solder ball 338 may be arranged on the aluminum oxide layer 336 formed on the copper 102 surface.

A wettability, also referred to as a degree of wetting, of a surface may be measured by a contact angle θ that may be measured between an interface of a liquid with the surface and a top surface of the liquid at an edge of the liquid. The wettability may depend on the liquid used for the measurement, but irrespective of this, a lower contact angle may indicate a higher wettability (with perfect wettability at 0°), and a maximum value of 180° may be indicative of perfect non-wettability. In a case of an unsymmetric distribution of the liquid (with different contact angles θ measured from different edges of the liquid), an average value may be used.

In various embodiments, a wettability of the aluminum oxide layer 336 in accordance with various embodiments may be substantially higher than a wettability of the conventional aluminum oxide layer 330 (not shown), which may be essentially non-wettable (i.e. may have a contact angle θ of 90° or more), at least unless a special flux is used.

A contact angle θ of a lead-free solder 338 on a pure copper 102 surface without using a flux may for example be around ((19.8°+24.2°)/2)=22°, as shown in FIG. 5A.

As shown in FIG. 5B, a contact angle θ of a lead-free solder 338 on the aluminum oxide layer 336 formed on a copper 102 surface in accordance with various embodiments may for example be about ((20.6°+22.4°)/2)=21.5°. This means that the wettability of the aluminum oxide layer 336 may in various embodiments be approximately the same as the wettability of a pure copper 102 layer.

In various embodiments, the wettability of the aluminum oxide layer 336 in accordance with various embodiments may vary with the metal included in the metal surface, with the thickness of the aluminum oxide layer 336 and with processing parameters like temperature and duration of the depositing and annealing processes, and with the solder 338 to be used for the soldering (and which may thus also be used for determining the contact angle). In general, the contact angle θ may be below about 40°, for example between about 10° and 25°, e.g. around 20°.

Figure 6A:
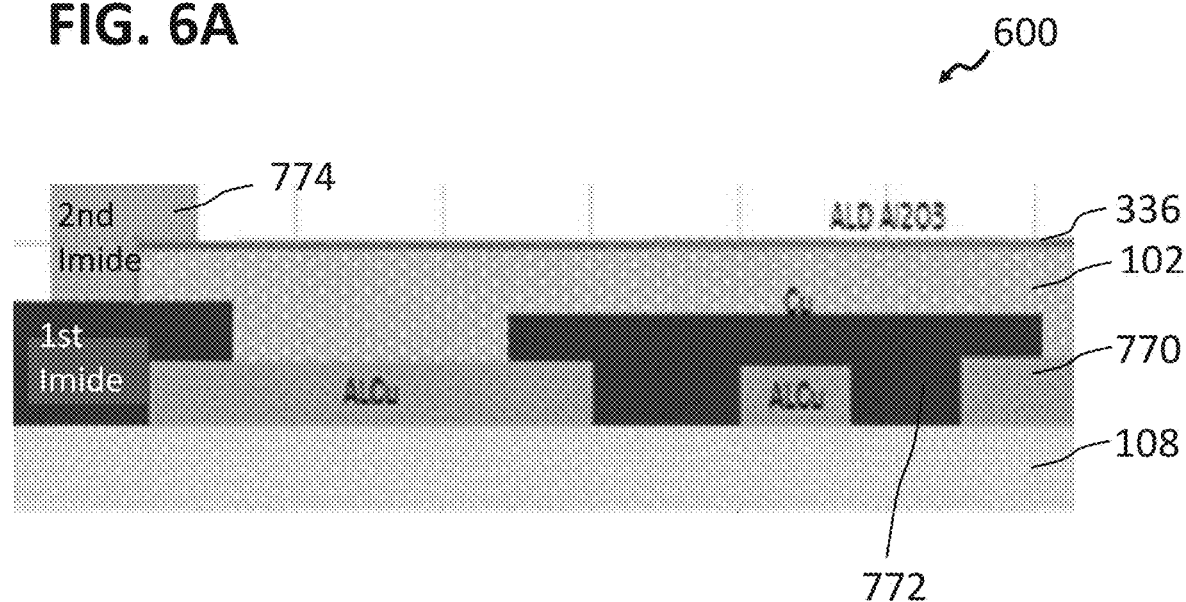
FIG. 6A and FIG. 6B each show a schematic cross-sectional view of an electronic device including a copper layer and an aluminum oxide layer in accordance with various embodiments formed thereon.
Figure 6B:
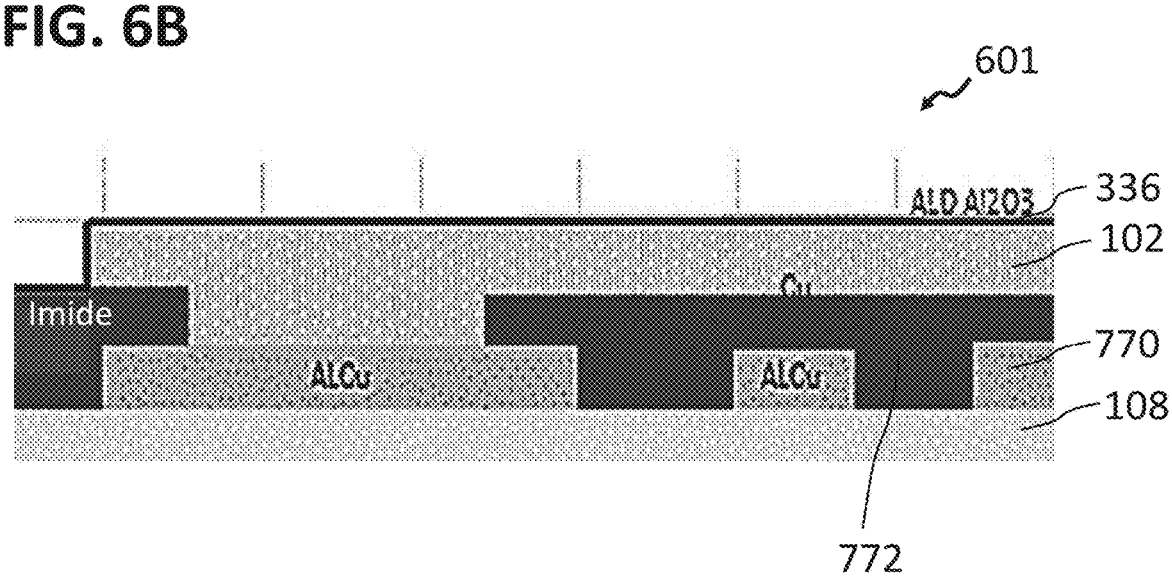

FIG. 6A and FIG. 6B each show a schematic cross-sectional view of an electronic device 600 and 601, respectively, including a copper 102 layer and an aluminum oxide layer 336 in accordance with various embodiments formed thereon. Thus, the aluminum oxide layer 336 in accordance with various embodiments may be integrated into the electronic devices 600, 601 in different ways.

As shown in FIG. 6A, the electronic device 600 may include a substrate 108, e.g. a semiconductor substrate 108, electrically conductive portions 770 (which may for example include an alloy, e.g. AlCu, but may also be formed of different electrically conductive materials), which may be formed over the substrate 108, electrically insulating portions 772 formed over the substrate 108 between the electrically conductive portions 770, wherein the electrically insulating portions 772 may for example include an imide, or any other suitable electrically insulating material 772.

In various embodiments, the electronic device 600 may further include a metal (e.g. copper, Cu) layer 102, which may be formed over the electrically conductive portions 770 contacting the electrically conductive portions 770, and optionally over the electrically insulating portions 772.

In various embodiments, an aluminum oxide layer 336 may be formed in accordance with various embodiments, e.g. as described above in context with FIG. 2B, FIG. 3B, and/or FIG. 4B, on the metal (e.g. copper, Cu) layer 102. The aluminum oxide layer 336 may prevent or at least delay an oxidation of a surface of the metal (e.g. copper) layer 102, and may nevertheless allow for forming an electrically conductive connection between a metal contact structure (not shown) and the metal (e.g. copper) layer 102, e.g. by soldering and/or by wire bonding. For achieving this, the aluminum oxide layer 336 may have an improved wettability for (e.g. lead free) solder as compared to a conventional aluminum oxide layer as e.g. described in context with FIG. 2A, FIG. 3A, and/or FIG. 4A.

In various embodiments, as for example shown in FIG. 6A, the aluminum oxide layer 336 may be integrated within an electronic device 600, e.g. within a chip arrangement. This may include forming at least one additional layer, e.g. an electrically insulating layer 774, e.g. including an imide or any other suitable electrically insulating material, at least partially over the aluminum oxide layer 336.

In various embodiments, as for example shown in FIG. 6B, the aluminum oxide layer 336 may be arranged on a top of an electronic device 601, e.g. as a final layer, e.g. of a chip arrangement. This may mean that no additional layer is arranged over the aluminum oxide layer 336, at least not before a forming of an electrically conductive contact to the metal (e.g. copper) layer 102 is established by/through the aluminum oxide layer 336.

In various embodiments, in a case of arranging the aluminum oxide layer 336 on an outer surface of the electronic device 600, 601, an interaction with assembly processes, like for example molding, may be considered. For example, a mold material may be selected that may adhere to the aluminum oxide layer 336, without causing adverse reactions that may damage either the aluminum oxide layer 336, the mold (not shown), or both.

FIG. 7 shows a process flow 700 for a method of forming an aluminum oxide layer according to various embodiments.

The method may include providing a metal surface including at least one metal of a group of metals, the group of metals consisting of copper, aluminum, palladium, nickel, silver, and alloys thereof (in 710), and depositing an aluminum oxide layer on the metal surface by atomic layer deposition, wherein a maximum processing temperature during the depositing is 280° C., such that the aluminum oxide layer is formed with a surface having a liquid solder contact angle of less than 40° (in 720).

A method of forming an aluminum oxide layer is provided, the method including providing a metal surface including at least one metal of a group of metals, the group of metals consisting of copper, aluminum, palladium, nickel, silver, and alloys thereof, and depositing an aluminum oxide layer on the metal surface by atomic layer deposition, wherein a maximum processing temperature during the depositing is 280° C., such that the aluminum oxide layer is formed with a surface having a liquid solder contact angle of less than 40°.

In various embodiments, the processing temperature during the depositing may be between 150° and 280° C.

In various embodiments, a total duration of the processing temperature being between 150° C. and 280° C. may be more than 30 minutes.

In various embodiments, the total duration of the processing temperature being between 150° C. and 280° C. may include an annealing process.

In various embodiments, the aluminum oxide layer may include copper at a percentage by mass of at least 5 wt %.

In various embodiments, the liquid solder may be a lead-free solder.

In various embodiments, the liquid solder may include tin.

In various embodiments, the aluminum oxide layer may have a thickness of between 1 nm and 12 nm.

In various embodiments, the method may further include, between the providing the metal surface and the depositing the aluminum oxide layer, removing an oxide layer from the metal surface.

In various embodiments, the oxide layer may be removed using a forming gas.

A surface structure is provided. The surface structure may include a metal surface including at least one metal of a group of metals, the group of metals consisting of copper, aluminum, palladium, nickel, silver, and alloys thereof, and an aluminum oxide layer deposited on the metal surface, wherein the aluminum oxide layer may have a surface having a liquid solder contact angle of less than 40°.

In various embodiments, the aluminum oxide layer may have a thickness of between 1 nm and 12 nm.

In various embodiments, the aluminum oxide layer may include copper at a percentage by mass of at least 5 wt %.

In various embodiments, the liquid solder may be a lead-free solder.

In various embodiments, the liquid solder may include tin.

An electronic device is provided, including the metal surface with the aluminum oxide layer in accordance with various embodiments, and a metal contact structure electrically conductively contacting the metal surface through or by the aluminum oxide layer.

In various embodiments, the electrically conductive contact between the metal contact structure and the metal surface may be a soldered contact.

In various embodiments, the soldered contact may include a lead-free solder.

In various embodiments, the soldered contact may include tin.

In various embodiments, the metal contact structure may be a bond wire.

In various embodiments, the bond wire may include copper or aluminum or gold.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

What is claimed is:

1. A method of forming an aluminum oxide layer, the method comprising:
   providing a metal surface comprising at least one metal of a group of metals, the group of metals consisting of copper, aluminum, palladium, nickel, silver, and alloys thereof; and
   depositing an aluminum oxide layer on the metal surface by atomic layer deposition, wherein a maximum processing temperature during the depositing is 280° C., such that the aluminum oxide layer is formed with a surface having a liquid solder contact angle of less than 40°.

2. The method of claim 1, wherein the processing temperature during the depositing is between 150° and 280° C.

3. The method of claim 2, wherein a total duration of the processing temperature being between 150° C. and 280° C. is more than 30 minutes.

4. The method of claim 3, wherein the total duration of the processing temperature comprises an annealing process.

5. The method of claim 1, wherein the aluminum oxide layer comprises copper at a percentage by mass of at least 5 wt %.

6. The method of claim 1, wherein the liquid solder is a lead-free solder.

7. The method of claim 1, wherein the liquid solder comprises tin.

8. The method of claim 1, wherein the aluminum oxide layer has a thickness of between 1 nm and 12 nm.

9. The method of claim 1, further comprising:
   between providing the metal surface and depositing the aluminum oxide layer, removing an oxide layer from the metal surface.

10. The method of claim 9, wherein the oxide layer is removed using a forming gas.

11. The method of claim 1, further comprising diffusing metal from the metal surface and into the aluminum oxide layer during or after depositing the aluminum oxide layer.

12. The method of claim 11, wherein the metal from the metal surface is diffused so as to extend to a top surface of the aluminum oxide layer that is opposite from the metal surface.

13. The method of claim 11, further comprising annealing the metal surface and the aluminum oxide layer after depositing the aluminum oxide layer, and wherein diffusing atoms from the metal surface and into the aluminum oxide layer comprises controlling a thermal budget of the depositing and the annealing to form spaces in the aluminum oxide layer which into which the atoms from the metal surface.

* * * * *